United States Patent [19]

Pace

[11] 4,042,834
[45] Aug. 16, 1977

[54] FREQUENCY DOUBLER CIRCUIT

[75] Inventor: W. David Pace, Tempe, Ariz.

[73] Assignee: Motorola, Inc., Chicago, Ill.

[21] Appl. No.: 707,809

[22] Filed: July 22, 1976

Related U.S. Application Data

[62] Division of Ser. No. 586,471, June 12, 1975.

[51] Int. Cl.$^2$ .................................. H03B 19/14
[52] U.S. Cl. .......................... 307/220 R; 328/20;
  328/140; 307/218; 307/246
[58] Field of Search ............ 328/20, 127, 150, 138,
  328/140; 307/220 R, 235 N, 235 P, 246, 218

[56] References Cited

U.S. PATENT DOCUMENTS

| | | | |
|---|---|---|---|
| 3,548,317 | 12/1970 | Bordonaro | 328/20 |
| 3,743,946 | 7/1973 | Gass et al. | 328/127 X |
| 3,753,012 | 8/1973 | Frederiksen et al. | 307/235 N |
| 3,770,327 | 11/1973 | Ruof | 328/20 X |
| 3,808,543 | 4/1974 | Mueller | 328/38 |

Primary Examiner—John S. Heyman
Attorney, Agent, or Firm—Maurice J. Jones, Jr.

[57] ABSTRACT

The frequency doubler includes circuits for charging and discharging a capacitor at a predetermined rate in response to each incoming cycle. First and second comparators are connected between the capacitor and the input of an OR gate. These comparators limit the magnitudes of the charged voltage and the discharged voltage of the capacitor. The OR gate responds to both comparators being off during a part of the rising portion of the capacitor waveform and during a part of the falling portion of the capacitor waveform by providing pulses having twice the repetition rate as the input pulses. An output circuit may be connected to the output terminal of the OR gate for converting the output signal of the OR gate into a further output signal comprised of current pulses having constant amplitude and duration.

6 Claims, 3 Drawing Figures

FREQUENCY DOUBLER CIRCUIT

This is division of application Ser. No. 586,471, filed June 12, 1975.

BACKGROUND OF THE INVENTION

1. Field of Invention

This invention relates to an improved tachometer and, more particularly, a tachometer of the type for use in measuring and comparing the angular velocities of at least two wheels of a vehicle in motion and providing output signals related to the angular velocities.

2. Prior Art

Increasing demand placed on the safety of the operation of motor vehicles in recent years lead industries to place greater emphasis on finding ways to improve the brake systems of vehicles. In connection with this there have been substantial research and development efforts focused on the dynamic control of the brake systems. As an important element, such a brake system requires suitable means that can sense and measure the speed of the wheel accurately and reliably and generate appropriate output signals. For such purpose generally tachometers have been used to sense and measure the angular speed of the wheels of a vehicle in motion and provide DC voltage output signals which are directly related to the angular speeds of the wheels.

Typically, a conventional tachometer includes transducing means for sensing the angular speed and providing a pulse train, the repetition rate of which varies in direct proportion to the change in the angular speed of the wheel. The pulse train so generated is frequency doubled and integrated to provide an output DC signal for the associated wheel. Two DC outputs obtained in the aforementioned manner for two wheels of a vehicle in motion are then usually compared and applied to appropriate terminals.

While the prior art tachometer provides satisfactory performance, yet there is a great need for improving the circuitry to provide a more accurate and reliable output signal and simplify the circuitry for ease of manufacture and for reducing the cost of the end product.

SUMMARY OF THE INVENTION

It is an object of the present invention to provide an improved tachometer.

It is another object of the present invention to simplify the circuitry of the tachometer.

It is still another object of the present invention to improve the performance of the tachometer.

The foregoing and other objects are achieved in accordance with the present invention by providing a highly accurate, reliable and simplified frequency doubler circuitry in the tachometer. According to a feature of the invention the frequency doubler includes capacitive means, means for charging and discharging the capacitive means in response to an incoming pulse train from the transducing means provided for sensing the angular speed of the wheels, means for providing a first and a second reference potentials of predetermined amplitudes, active means interposed between the reference potentials and the capacitive means for limiting the charge and discharge voltages across the capacitive means to a first and a second fixed amplitude as determined by the first and second reference potentials so that the duration of the charge and the discharge are timed to a same time period and generating an output pulse train marking the charge and the discharge of the capacitive means so that the output pulse train has pulses of the same pulse width and amplitude and twice the repetition rate of the incoming pulse train.

Advantageously the tachometer in accordance with the present invention provides highly accurate output signals correctly proportioned to the angular speed of the wheels it is designed to measure.

According to another feature of the invention the circuitry is designed to be simple, compact and designed to be incorporable into a single integrated circuit chip.

The foregoing and other objects, features and advantages of the present invention will become clearer from the following detailed description of an illustrative embodiment in conjunction with accompanying drawings.

DETAILED DESCRIPTION

Figure 1:
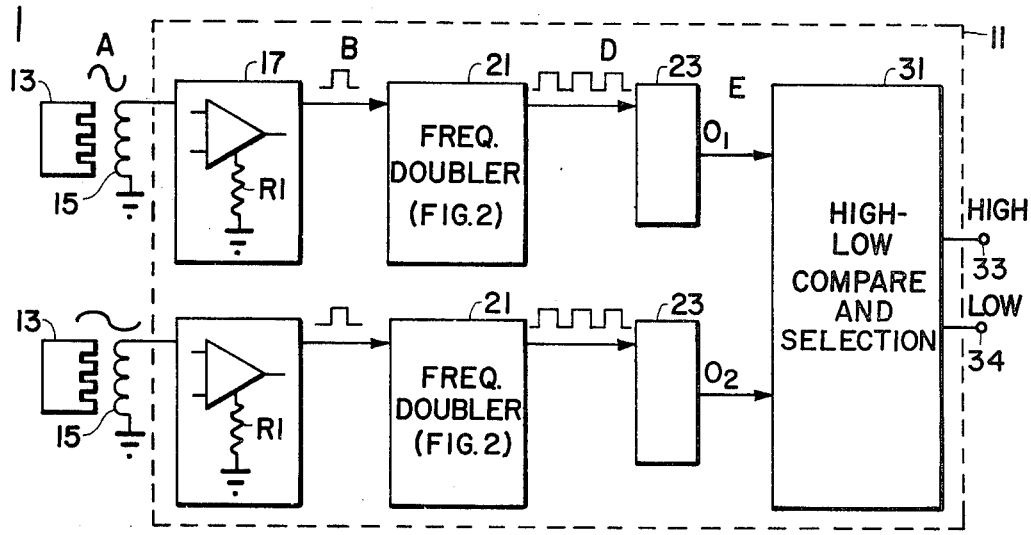
FIG. 1 shows a functional block diagram of a tachometer.
Figure 3:
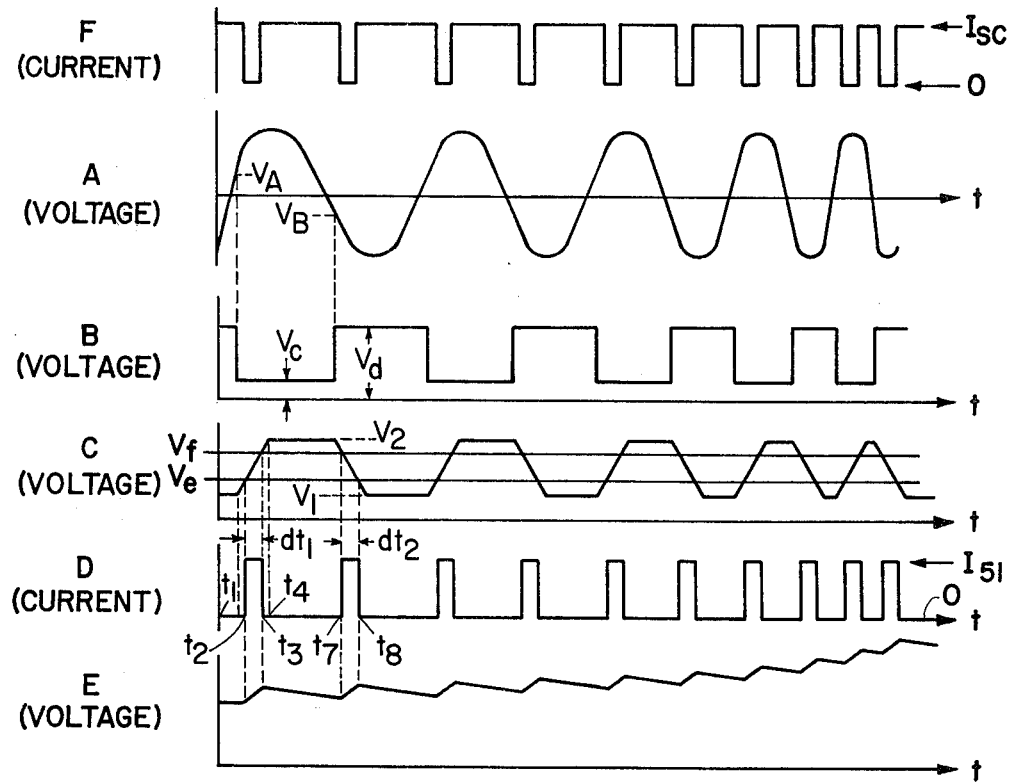
FIG. 3 shows timing diagrams helpful to explaining the understanding of the operation of the tachometer in accordance with the present invention.

Referring generally to FIGS. 1 and 3, a tachometer 11 is often used to measure the angular speeds of two wheels (not shown). Associated with each wheel, usually there is provided means for sensing the angular speed of the wheels which includes suitable means, such as a magnetic element 13, with one edge shaped to provide a rectangular sawtooth wave as schematically illustrated. Typically, such a magnetic element is fixedly attached to the wheel. The sensing means also includes an inductive coil 15 mounted fixedly to the frame of the vehicle. The coil 15 acts as an inductive transducer and senses the time varying magnetic field produced by the magnetic element 13 passing thereby as the wheel rotates.

The induced signal may be in the form of a sinusiodal wave (FIG. 3A), the frequency of which varies dynamically in proportion to the change in the angular speed of the wheel. The wave is then processed through a network of circuitry which is designed to convert it into a pulse train of the current pulses of same amplitude and pulse width (FIG. 3D). The network includes a comparator 17 designed to compare the incoming sinusiodal wave to a reference threshold voltage and generate a rectangular train of pulses of corresponding repetition rate. The comparator 17 may be of any suitable conventional type having a threshold adjusting resistive means R1, the resistance of which can be varied to suitable amplitude to establish reference voltages of $V_A$ and $V_B$ at which the comparator output is switched from one level to another (FIG. 3B $V_c$ and $V_d$). The resulting pulse train (FIG. 3B) is then applied to a frequency doubler 21 which doubles the repetition rate of the incoming pulse train in a unique manner, as shall be described in detail hereinafter.

The frequency doubled pulse train (FIG. 3D) is then integrated by a conventional current integrator 23 to provide an output DC potential the amplitude of which varies in proportion to the change in the angular speed of the wheel (see FIG. 3E).

In the aforementioned manner, two identical networks of comparator, frequency doubler and integrators are provided to measure the angular speed of two wheels of a motor vehicle for providing two time varying DC output voltages at the two integrator outputs, $O_1$ and $O_2$. The tachometer usually includes additional circuitry 31 designed to track, compare and select the two outputs, $O_1$ and $O_2$ and apply the higher of the two to a terminal 33 for the higher output and the lower of the two to a terminal 34 for the lower output. The output at the high and low output terminals, 33 and 34, are then utilized by a suitable utilization circuitry such as antiskid control circuitry for controlling the brake mechanism (not shown) of the vehicle.

Advantageously, in accordance with the present invention, a highly simplified, reliable and accurate frequency doubler is utilized to provide the frequency doubling function. The frequency doubler is designed to double the repetition rate of the incoming pulse train (FIG. 3B) as follows. More particularly, referring to FIG. 2, the frequency doubler includes a suitable circuitry 35 that converts the input pulse train (FIG. 3B) into two currents of the same amplitude but of an opposite polarity, $+I_{SC}$ and $-I_{SC}$. The frequency doubler is also provided with a charge storage means C and a circuitry 36 for providing two reference potentials $V_1$ and $V_2$. The circuitry 36 is designed to control the level to which the storage means C is charged and discharged to the predetermined levels established by and in relation to the reference potentials $V_1$ and $V_2$. The output of the circuitry 36 at its output terminal 37 is in the form of a current pulse train of a constant pulse width. This output may then be converted by a conventional conversion circuit 39 into a current pulse train of the same pulse width and constant amplitude suitable for conventional current integration.

Figure 2:
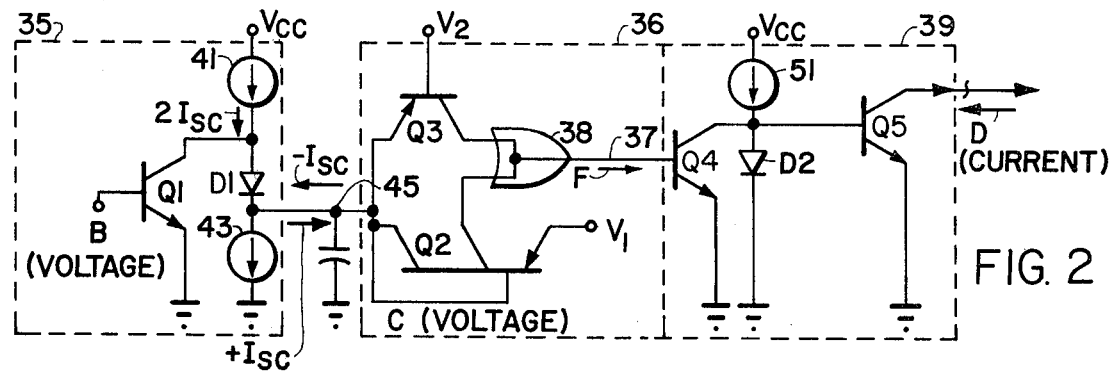
FIG. 2 shows a detailed schematic circuitry of the frequency doubler of the tachometer in accordance with the present invention.

Referring to FIG. 2, more specifically, the circuitry 35 for converting the input pulse train into two currents of the opposite polarity may include a transistor Q1, a diode D1 and two current sources 41 and 43 operatively connected and configured, as illustrated, in a conventional manner. In operation, such a conversion circuit operates as follows. Q1 is made to conduct by an application of the input pulse (FIG. 3B) as the input at the base electrode goes from lower voltage $V_c$ to a higher voltage $V_d$. When Q1 conducts, the anode electrode of the diode D1 is grounded. This causes the constant current $2I_{SC}$ from the constant current source 41 to flow through the transistor Q1. When this happens the charge stored in the capacitor C is discharged through the current drain 43. The drain 43 fixes the amplitude of the drain current to $I_{SC}$. So the current $-I_{SC}$ flows from the capacitor C to the ground via the constant current drain 43, as shown by an arrowed current $I_{SC}$.

Now as the voltage at the input of Q1 goes from high, $V_d$ to low, $V_c$, Q1 becomes nonconductive. In response, Q1 turns off and removes the ground from the anode electrode of the diode D1. Consequently, now the current $2I_{SC}$ flows from the source 41 to the diode D1. In turn $I_{SC}$ flows into the capacitor C as follows. Since the current drain $I_{SC}$ can drain only a fixed amplitude of current, namely $I_{SC}$, the balance of $2I_{SC}$, namely $+I_{SC}$, flows into the capacitor C and charges it. This is shown by a $+I_{SC}$ with an arrow to the capacitor C. Thus, the circuitry 33 either supplies a current of $+I_{SC}$ into the capacitor C when the transistor Q1 is not conducting or removes the same amount of current from the capacitor when the transistor Q1 is conducting.

The time duration of the charge and the discharge of the storage means, C, with the constant amplitude current $+I_{SC}$ and $-I_{SC}$ is established by the circuit 36 as follows. The circuit 43 includes a pair of transistors Q2 and Q3 configured to function as comparators. The transistors Q2 and Q3 are connected so that they provide the reference potential $V_1$ and $V_2$ to the capacitor C. The transistors Q2 and Q3 are configured and operatively coupled to the reference potentials $V_1$ and $V_2$ to impose voltage limitations through which the capacitor charges and discharges. The circuitry is configured as shown where the emitter electrode of a PNP transistor Q3 is connected to the capacitor C via a junction 45 and the base electrode of the transistor Q2 is connected also to junction 45 and the respective base or emitter electrodes are coupled to the reference potentials, $V_1$ and $V_2$. As illustrated in FIGS. 3B, C and F, D, during a portion of charging and discharging time intervals, $dt_1$ and $dt_2$, of the capacitor C, the transistors Q2 and Q3 becomes non-conductive. Since the amount of the current being used to charge and discharge is the same, i.e., $I_{SC}$, the time duration, $dt_1$ and discharge, $dt_2$, is the same. The time duration is fixed as follows. As the capacitor begins to charge by $+I_{SC}$ the voltage at the junction 45 begins to increase from say time, $t_1$. This continues on and when the junction potential across the capacitor reaches a magnitude $V_e$ at $t_2$, enough to reverse bias Q2, Q2 becomes nonconductive. In turn, the collector of Q2 begins to be nonconductive and switches its current level from level $I_{SC}$ to zero (FIG. 3F). This continues until the voltage at the junction 45 reaches to a level $V_f$ such that the forward bias drop across the emitter-base junction is enough to sustain the conduction of Q3. At this point, Q3 becomes conductive. This sets the time duration, $dt_1$, during which the doubler output, 37, is zero current. The capacitor continues to charge a little further to time $t_4$, until potential at 45 reaches point where $V_2$ and Q3 do not permit further charge. This is the case because all of the charge current, $+I_{SC}$, is diverted from the capacitor into transistor Q3.

Now as the input to the circuit 33 changes from low to high, $V_c$ to $V_d$, (FIG. 3B) at $t_6$, C begins to discharge as $-I_{SC}$ is drained therefrom to ground via the current drain 43. Now the reverse of what took place earlier during the charging cycle takes place; that is as C begins to discharge to a certain level at $t_7$, Q3 switches from conducting to non-conducting state. This continues till $t_8$, when the Q2 switches on as the voltage at junction 45 reaches $V_e$.

From the foregoing it is clear that by adjusting the circuit parameters of Q2 and Q3, capacitor C and reference potentials $V_1$ and $V_2$, the time duration in which Q2 and Q3 are simultaneously non-conductive is fixed to a desired optimal value.

The output, i.e., the collector electrodes of Q2 and Q3 may be wired ORed as shown to provide the output current pulse train as shown in FIG. 3F. Note as illustrated in FIG. 3F and as described above the time duration of the pulse width are fixed to have the same duration and fixed to occur twice per cycle of the input sinusoidal wave from the transducer 15 and time related to the leading and lagging edges of the square wave input to the doubler circuitry.

The output of the wired OR circuit 36 is in the form of a current waveform and is applied to the converter circuit 39 that converts the wave into a current output wave with a constant current pulse amplitude and duration. Such a conversion circuitry may be of a conventional type as illustrated in FIG. 2 that includes a first transistor Q4 and a second transistor Q5 connected in a common emitter configuration and in series. There is interposed a constant current source 51 of a given amplitude connected at the junction between the collector electrode of the first transistor Q4 and the base electrode of second transistor Q5. A properly poled diode D2 is connected between the ground and the base electrode of the transistor Q5. In operation, Q4 conducts when the output of the OR circuit 38 at terminal output 37 is high and becomes nonconductive when it is low. When Q4 conducts, the current from the current source 51 is drained therethrough. This causes Q5 to be nonconductive and its output current goes low. As transistor Q4 becomes nonconductive, its collector electrode potential becomes high. This causes Q5 and D2 to be forward biased and become conductive. The output of Q5 obtained as above is applied to the integrating circuitry 23 in a conventional manner to provide a DC output (FIG. 3E). The output of the two integraters 23 and 23' are respectively supplied to the compare and selection circuitry of a conventional design which is adapted to provide the higher output to the higher amplitude output terminal 33 and the lower output to the lower amplitude output terminal 34.

In summary, in accordance with the present invention there is provided a tachometer for sensing the angular speed of two wheels of a motor vehicle to derive two DC outputs which may then be used as is or put through the high-low compare and select circuit 31 to the high or low output terminals by the output utilization means such as brake control circuitry. In accordance with the present invention a unique frequency doubler circuitry is used to accurately double the repetition rate of the input thereto to provide a pulse train having pulses of the same width and duration. Advantageously the tachometer circuitry of the present circuitry are made of circuits elements which render it possible to make the entire tachometer circuitry 11 in a single chip integrated circuit form. Various other modifications and changes may be made to the present invention without departing from the spirit and scope of the invention as described above.

What is claimed is:

1. A frequency doubler circuit comprising:
   means for providing a capacitance;
   means for charging and discharging said capacitance in response to input pulses;
   means for providing a first reference potential of a first predetermined magnitude and a second reference potential of a second predetermined magnitude;
   ORing means;
   first transistor means having main electrodes and a control electrode, said main electrodes being directly coupled between said means for providing a capacitance and said ORing means, said control electrode being adapted to receive said first reference potential; and
   second transistor means having main electrodes and a control electrode, said main electrodes of said second transistor means being directly coupled between said means for providing a capacitance and said ORing means, said control electrode of said second transistor means being adapted to receive said second reference potential.

2. The frequency doubler circuit of claim 1 wherein said means for charging and discharging said capacitance includes:
   current supply means for providing a current of a first predetermined magnitude, said current supply means being coupled to said means for providing a capacitance;
   current drain means for drawing a current having a second predetermined magnitude which is less than said first predetermined magnitude from said capacitance, said current drain means being connected to said means for providing a capacitance; and
   third transistor means having main electrodes connected with said current supply means and a control electrode adapted for receiving control signals, said third transistor means being rendered conductive in response to said control signals of a first level to shunt current from said current supply means away from said capacitance so that said capacitance discharges and said third transistor means being rendered nonconductive in response to said control signals of a second level to allow the current from said current supply means to charge said capacitance at a predetermined rate.

3. The frequency doubler circuit of claim 1 wherein said first transistor means includes emitter and collector electrodes corresponding to said main electrodes thereof and a base electrode corresponding to said control electrode thereof.

4. The frequency doubler circuit of claim 1 wherein said second transistor means includes first and second collector electrodes corresponding to said main electrodes thereof and an emitter electrode corresponding to said control electrode thereof, and a base electrode, said base electrode of said second transistor means being connected to said first collector electrode thereof and said second collector electrode of said second transistor means being coupled to said ORing means, said first collector electrode further being coupled to said means for providing a capacitance.

5. The frequency doubler circuit of claim 16 further including current converter circuit coupled to the output of said ORing means.

6. The frequency doubler circuit of claim 5 wherein said current converter circuit includes:
   additional electron control means having a control electrode and main electrodes, said control electrode of said additional electron control means being coupled to said ORing means;
   current supply means coupled in series with said main electrodes of said additional electron control means; and
   further electron control means having a control electrode connected to said output terminal of said current supply means and main electrodes for providing an output signal for the frequency doubler circuit.

* * * * *